United States Patent
Shono (10) Patent No.: US 8,530,996 B2
(45) Date of Patent: Sep. 10, 2013

(54) BUCK REGULATOR STRUCTURE COMPRISING HIGH-SIDE AND LOW-SIDE VOLTAGE HEMT TRANSISTORS

(75) Inventor: Ken Shono, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 91 days.

(21) Appl. No.: 13/161,377

(22) Filed: Jun. 15, 2011

(65) Prior Publication Data

US 2012/0098038 A1    Apr. 26, 2012

(30) Foreign Application Priority Data

Oct. 22, 2010    (JP) .................................. 2010-237484

(51) Int. Cl.
*H01L 21/70*    (2006.01)

(52) U.S. Cl.
USPC ................... 257/500; 257/299; 257/E29.246; 257/E27.064; 323/282; 438/128; 438/172

(58) Field of Classification Search
USPC ................................................. 257/500, 299
See application file for complete search history.

(56) References Cited

U.S. PATENT DOCUMENTS

| | | | |
|---|---|---|---|
| 7,687,902 B2 | 3/2010 | Shiraishi et al. | |
| 7,863,877 B2 | 1/2011 | Briere | |
| 7,910,984 B2 | 3/2011 | Yamaguchi et al. | |
| 2005/0142709 A1* | 6/2005 | Park | 438/167 |
| 2008/0169474 A1* | 7/2008 | Sheppard | 257/76 |
| 2010/0059795 A1* | 3/2010 | Azrai | 257/207 |

FOREIGN PATENT DOCUMENTS

| | | |
|---|---|---|
| JP | 2005-203766 A | 7/2005 |
| JP | 2006-049341 A | 2/2006 |
| JP | 2008-187167 A | 8/2008 |
| JP | 2009-170747 A | 7/2009 |

* cited by examiner

*Primary Examiner* — Marcos D. Pizarro
*Assistant Examiner* — Cesar Lopez
(74) *Attorney, Agent, or Firm* — Fujitsu Patent Center (57) ABSTRACT

A semiconductor device includes a high-side field-effect transistor including a high-side drain electrode, a high-side gate electrode, and a high-side source electrode; and a first low-side field-effect transistor including a first low-side drain electrode, a first low-side gate electrode and a first low-side source electrode, wherein the high-side source electrode and the first low-side drain electrode are shared as a single source and drain electrode, and the high-side drain electrode, the high-side gate electrode, the source and drain electrode, the first low-side gate electrode and the first low-side source electrode are arranged in this order while being interposed by gaps, respectively.

9 Claims, 5 Drawing Sheets

BUCK REGULATOR STRUCTURE COMPRISING HIGH-SIDE AND LOW-SIDE VOLTAGE HEMT TRANSISTORS

CROSS-REFERENCE TO RELATED APPLICATIONS

This patent application is based upon and claims the benefit of priority of the prior Japanese Patent Application No. 2010-237484 filed on Oct. 22, 2010, the entire contents of which are incorporated herein by reference.

FIELD

A certain aspect of the embodiments discussed herein is related to a semiconductor device.

BACKGROUND

A buck regulator converter such as a semiconductor device may have a structure in which a high-side transistor and a low-side transistor are connected. The buck regulator converter is used to convert a direct-current high-side to a direct-current low-side. For example, field-effect transistors (FET) may be used respectively as the high-side transistor and the low-side transistor. The field-effect transistors (FET) may be high-electron-mobility transistors (HEMT).

Japanese Laid-open Patent Publication No. 2008-187167 discloses that the low-side and high-side driver switches being group-III nitride devices are formed in a semiconductor substrate and a trench insulating from a connection between the low-side and high-side driver switches is formed in the semiconductor substrate. The trench is filled with an insulator. The low-side and high-side driver switches respectively include drain, source and gate electrodes.

Japanese Laid-open Patent Publication No. 2005-203766 discloses that high-side and low-side transistors are formed in different semiconductor substrates, and the transistors are connected by wiring on the semiconductor substrates to obtain a DC-DC converter.

Japanese Laid-open Patent Publication No. 2006-049341 discloses that a non-insulated DC-DC converter in which a high-side transistor and a low-side transistor serially connected and the low-side transistor and a schottky barrier diode connected in parallel to the low-side transistor are formed in an identical semiconductor chip.

The non-insulated DC-DC converter has the schottky barrier diode in the center of the semiconductor chip and the low-side transistor on both sides of the semiconductor chip.

Japanese Laid-open Patent Publication No. 2009-170747 discloses that high-side and low-side transistors for a DC-DC converter are formed in different regions of a silicon substrate. With the structure, a drain region of the low-side transistor is formed on a lower surface side of a silicon substrate and the source region of the high-side transistor is formed on the upper layer of the silicone substrate. The drain region of the low-side transistor and the source region of the high-side transistor are connected via a connection member inside a trench penetrating the semiconductor substrate.

SUMMARY

According to an aspect of the embodiments, a semiconductor device including a high-side field-effect transistor including a high-side drain electrode, a high-side gate electrode, and a high-side source electrode; and a first low-side field-effect transistor including a first low-side drain electrode, a first low-side gate electrode and a first low-side source electrode, wherein the high-side source electrode and the first low-side drain electrode are shared as a single source and drain electrode, and the high-side drain electrode, the high-side gate electrode, the source and drain electrode, the first low-side gate electrode and the first low-side source electrode are arranged in this order while being interposed by gaps, respectively.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENT

In a buck regulator structure of connecting a high-side transistor having a relatively higher voltage and a low-side transistor having a relatively lower voltage, the more the number of wires for connecting the high-side and low-side transistors increase, the more the inductance and register of a circuit increase. Therefore, a performance of a buck regulator converter may be degraded.

Figure 1:
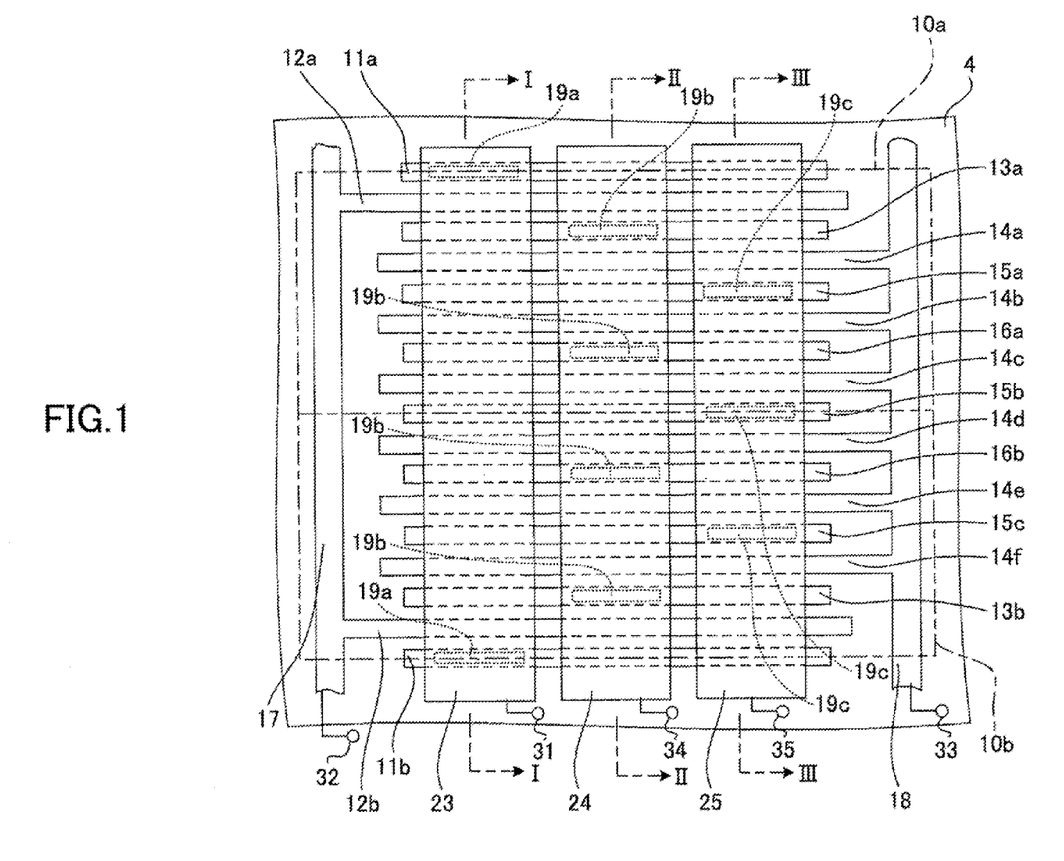
FIG. 1 is a plan view illustrating a semiconductor device of an Embodiment.
Figure 2A:
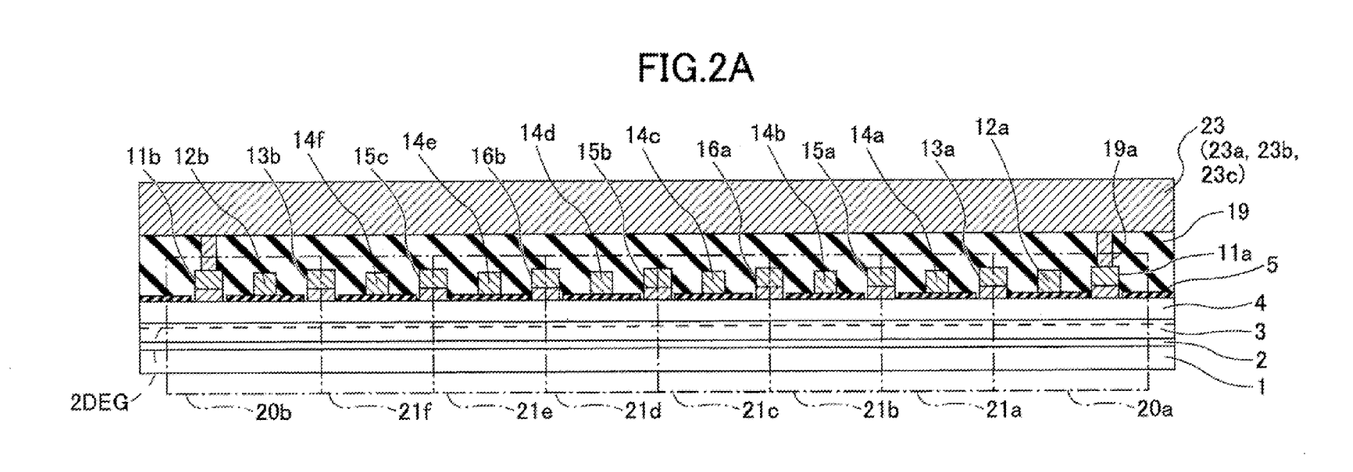
FIG. 2A, FIG. 2B and FIG. 2C are cross-sectional views illustrating the semiconductor devices of the Embodiment.
Figure 2B:
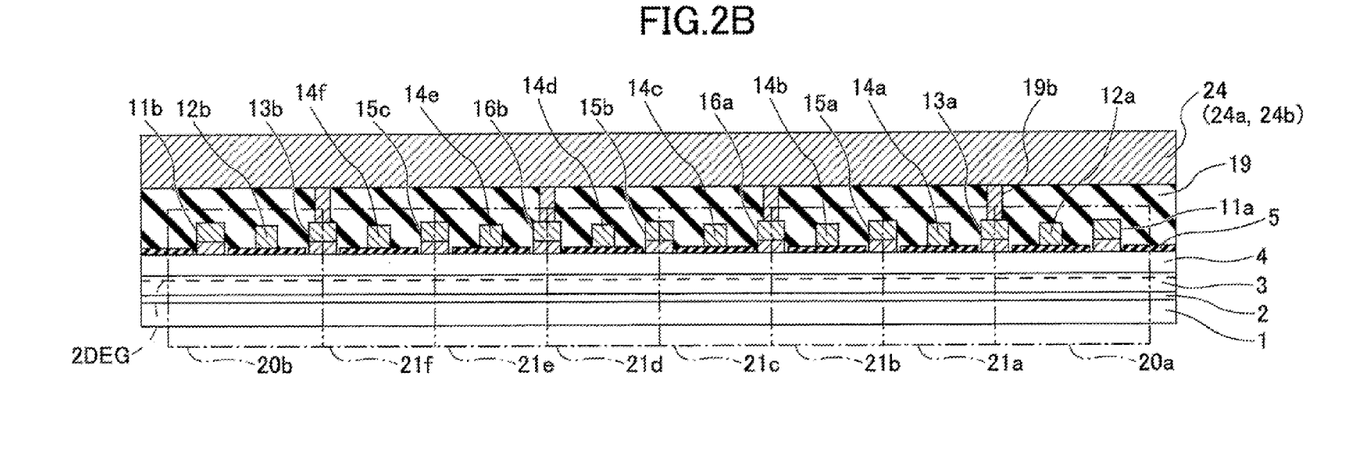
Figure 2C:
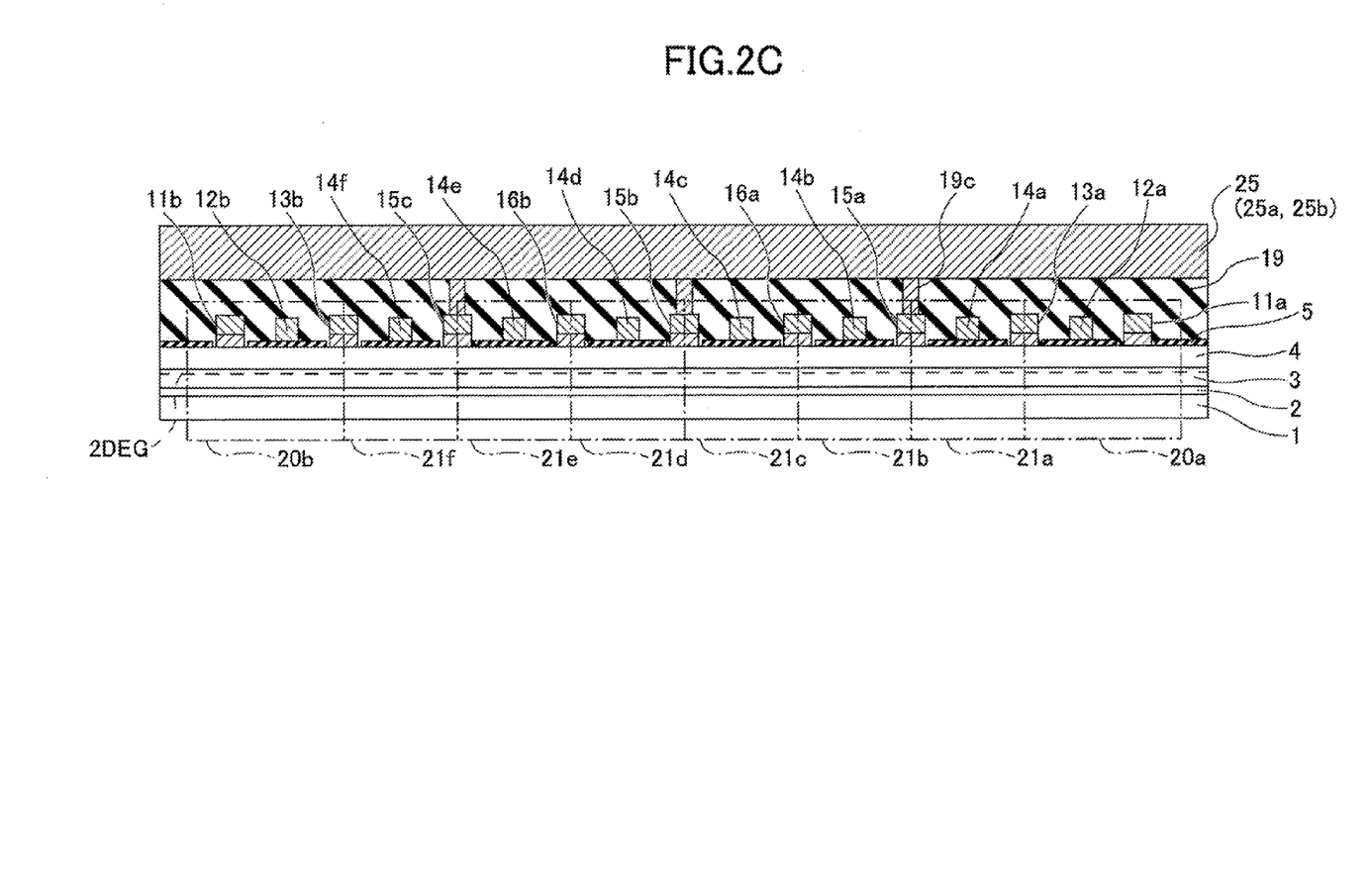

The embodiments will be explained with reference to accompanying drawings. In figures, the same reference symbols are given to similar portions. FIG. 1 is a plan view of a semiconductor device according to the Embodiment. FIG. 2A to FIG. 2C are cross-sectional views taken along lines I-I, II-II and III-III, respectively.

Referring to FIG. 1, FIG. 2A, FIG. 2B and FIG. 2C, a buffer layer 2, a gallium nitride (GaN) channel layer 3, and a gallium nitride (GaN) aluminum (AlGaN) electron supplying layer 4 are sequentially formed with a metalorganic chemical vapor deposition (MOCVD). In the channel layer 3, a two-dimensional electron gas (2DEG) is generated by an intrinsic polarization and a piezo polarization in a boundary region between the channel layer 3 and the electron supplying layer 4. The buffer layer 2 may be an AlN/GaN layer or an ALGaN layer.

On the electron supplying layer 4, a first high-side drain electrode 11a and a first high-side gate electrode 12a are sequentially formed in a direction and being interposed by gaps. On the electron supplying layer 4, a first source and drain (source/drain) electrode 13a in a stripe-like shape is formed on one side of the high-side gate electrode 12a, and a gap is provided between the high-side gate electrode 12a and the first source and drain (source/drain) electrode 13a.

On the electron supplying layer 4, first to sixth low-side gate electrodes 14a to 14f in stripe-like shapes are sequentially formed on the one side of the source/drain electrode 13a, and gaps are respectively provided between the first to sixth low-side gate electrodes 14a to 14f. There are five regions between the first to sixth low-side gate electrodes 14a to 14f. In the odd-numbered regions counted from the first source/drain electrode 13a, low-side source electrodes 15a, 15b and 15c are formed. Gaps are respectively provided between the low-side gate electrodes 14a and 14b, 14c and 14d, and 14e and 14f and the low-side source electrodes 15a, 15b and 15c.

In the even-numbered regions counted from the first source/drain electrode 13a, low-side drain electrodes 16a and 16b are formed. Gaps are respectively provided between the low-side gate electrodes 14b and 14c, and 14d and 14e and the low-side drain electrodes 16a and 16b.

Further, on one side of the sixth low-side gate electrode 14f most apart from the first high-side gate electrode 12a, a second source/drain electrode 13b, a second high-side gate electrode 12b and a second high-side drain electrode 11b are sequentially formed.

One ends of the first and second high-side gate electrodes 12a and 12b are connected to a high-side gate wiring 17. The other ends of the low-side gate electrodes 14a to 14f are connected to a low-side gate wiring 18.

The first and second source/drain electrodes 13a, 13b, the low-side drain electrode 16a, 16b, and the low-side source electrodes 15a, 15b, 15c are formed by patterning a conductive film formed on the electron supplying layer 4. The conductive film on the electron supplying layer 4 may be made of a material performing an ohmic contact, for example, a laminated structure of a titanium layer and an aluminum layer.

A dielectric layer 5 is formed among the first and second high-side drain electrodes 11a and 11b, the first and second source/drain electrodes 13a and 13b, the low-side source electrodes 15a to 15c, and the low-side drain electrodes 16a and 16b on the electron supplying layer 4. The dielectric layer 5 may be an aluminum oxide layer. The aluminum oxide layer is patterned by a lift-off method using a resist pattern.

The first and second high-side gate electrodes 12a and 12b, the high-side gate wiring 17, the low-side gate electrode 14a to 14f, and the low-side gate wiring 18 are formed by pattering the conductive layer formed on the dielectric layer 5. For example, an aluminum layer is formed as the conductive layer.

The materials of the first and second gate electrodes 12a and 12b and the low-side gate electrode 14a to 14f may be a metallic material connected to the electron supplying layer 4 with a shottky contact. No dielectric layer is formed among the first and second high-side gate electrodes 12a and 12b and the low-side gate electrode 14a to 14f on the electron supplying layer 4.

The high-side gate electrode 12a, 12b and the low-side gate electrode 14a to 14f have a stripe-like shape and the widths of the high-side gate electrode 12a, 12b and the low-side gate electrode 14a to 14f are about 0.5 µm. The first and second high-side drain electrodes 11a and 11b, the first and second source/drain electrodes 13a and 13b, the low-side source electrodes 15a to 15c, and the low-side drain electrodes 16a and 16b have a stripe-like shape and the widths of these are about 1 µm to 2 µm.

The high-side gate electrodes 12a and 12b, the high-side drain electrodes 11a and 11b, the high-side gate wiring 17 and an insulating layer 19 covering the source/drain electrodes 13a and 13b are formed on the electron supplying layer 4. The insulating layer 19 covers the low-side gate electrodes 14a to 14f, the low-side source electrodes 15a to 15c, the low-side drain electrodes 16a and 16b, and the low-side gate wiring 18. The insulating layer 19 may be a silicon oxide layer and a silicon nitride layer formed by a CVD method. The insulating layer 19 and the dielectric layers 5 are not illustrated in the plan view of FIG. 1.

A first high-electron-mobility transistor (HEMT) 20a is formed by a region including the first high-side gate electrode 12a, the first high-side drain electrode 11a and the first source/drain electrode 13a, the electron supplying layer 4 below the region, the channel layer 3 below the electron supplying layer 4, and the like.

In a similar manner thereto, the second high-electron-mobility transistor (HEMT) 20b is formed by the second high-side gate electrode 12b, the second high-side drain electrode 11b, the second source/drain electrode 13b, the electron supplying layer 4, the channel layer 3, and the like.

The low-side high-electron-mobility transistor (HEMT) 21a is formed by a region including the first low-side gate electrode 14a, the first source/drain electrode 13a provided on both sides of the first low-side gate electrode 14a, and the source region 15a, an electron supplying layer 4 below the region, a channel layer 3 below the electron supplying layer 4, and the like. In a similar manner thereto, the low-side high-electron-mobility transistor (HEMT) 21f is formed by a region including the sixth low-side gate electrode 14a, the first source/drain electrode 13b provided on both sides of the sixth low-side gate electrode 14f, and the source region 15c, an electron supplying layer 4 below the region, a channel layer 3 below the electron supplying layer 4, and the like.

Four high-electron-mobility transistors (HEMT) 21b to 21e are formed by a region including the second to fifth low-side gate electrodes 14b to 14e, the low-side source electrodes 15a to 15c, the low-side drain electrodes 16a and 16b, the electron supplying layer 4 below the region, the channel layer 3 below the electron supplying layer 4, or the like.

A first buck regulator circuit 10a includes the first high-side HEMT 20a including the first high-side gate electrode 12a and the three low-side HEMT 21a to 21c adjacent to the first high-side gate electrode 12a. A second buck regulator circuit 10b includes the second high-side HEMT 20b including the second high-side gate electrode 12b and the three low-side HEMT 21d to 21f adjacent to the second high-side gate electrode 12b.

A boundary between the first buck regulator circuit 10a and the second buck regulator circuit 10b exists in the low-side source electrode 15b positioned in a middle of a region between the first and second high-side gate electrodes 12a and 12b. The first and second buck regulator circuits 10a and 10b are symmetrically formed with respect to the longitudinal line of the low-side source electrode 15b.

In the insulating layer 19 illustrated in FIG. 2A, plural first via holes 19a reaching the first and second high-side drain electrodes 11a and 11b are formed in a region in the vicinity of the high-side gate electrode wiring 17 illustrated in FIG. 1. In the insulating layer 19 illustrated in FIG. 2B, plural second via holes 19b reaching upper surfaces of the source/drain electrode 13a and 13b and the low-side drain electrode 16a and 16b in a central region illustrated in FIG. 1. In the insulating layer 19 illustrated in FIG. 2C, plural second via holes 19c reaching upper surfaces of the low-side source electrode 15a, 15b and 15c in a region in the vicinity of the low-side gate wiring 18 illustrated in FIG. 1.

On the insulating layer 19, a voltage applying wiring 23 is connected to the first and second high-side drain electrodes 11a and 11b through first via holes 19a. The voltage applying wiring 23 is in a strip-like shape and traverses longitudinal directions of the high-side gate electrodes 12a and 12b and the first and second the low-side gate electrodes 14a to 14f.

On the insulating layer 19, an output wiring 24 in a strip-like shape is connected to the first and second source/drain electrodes 13a and 13b, the low-side drain electrodes 16a and 16b through the second via holes 19b. The output wiring 24 is adjacent to the voltage applying wiring 23 while being interposed by a gap from the voltage applying wiring 23.

On the insulating layer 19, a ground wiring 25 in a strip-like shape is connected to the low-side source electrodes 15a, 15b and 15c through the third via holes 19c. The ground wiring 25 is adjacent to the output wiring 24 while being interposed by a gap from the output wiring 24.

The voltage applying wiring 23, the output wiring 24 and the ground wiring 25 are formed by patterning a metallic film such as gold and aluminum formed on the insulating layer 19.

Figure 3A:
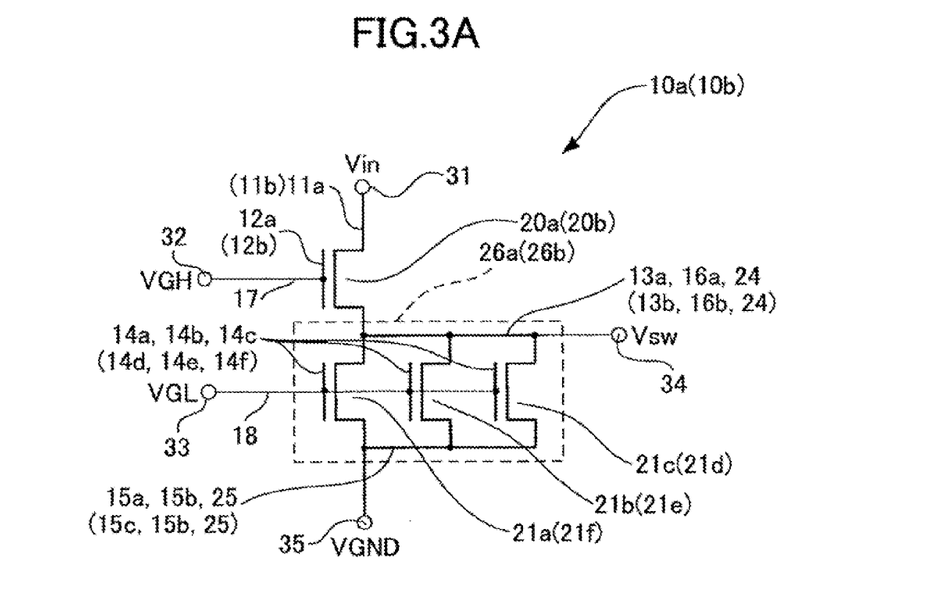
FIG. 3A and FIG. 3B are equivalent circuits of the semiconductor device of the Embodiment.

As described, the first buck regulator circuit 10a indicated by an equivalent circuit of FIG. 3A is formed by the high-side HEMT 20a and 20b and the low-side HEMT 21a to 21f.

Referring to FIG. 1, FIG. 2A, FIG. 2B, FIG. 2C and FIG. 3A, the first high-side HEMT 20a is connected to the three low-side HEMTs 21a, 21b and 21c in serial via the first source/drain electrode 13a, the output wiring 24 and the ground wiring 25. The low-side HEMTs 21a, 21b and 21c connected to the first high-side HEMT 20a are connected in parallel by the low-side source electrodes 15a, 15b and 15c, the low-side drain electrode 16a and 16b, the output wiring 24, and the grounding wiring 25.

The first high-side drain electrode 11a of the high-side HEMT 20a is connected to a first terminal 31 to which a voltage Vin is applied via the voltage applying wiring 23. The high-side gate electrode 12a of the high-side HEMT 20a is connected to a second terminal 32 to which a control signal voltage VGH is applied via a high-side gate wiring 17.

The low-side gate electrodes 14a to 14c of the three low-side HEMTs 21a to 21c adjacent to the high-side HEMT 20a are connected via the low-side gate wiring 18 to a third terminal 33 to which a synchronizing signal voltage VGL is applied.

The first source/drain electrode 13a is a common electrode functioning as the drain electrode of the low-side HEMT 21 and a source electrode of the high-side HEMT 20a. The first source/drain electrode 13a and the low-side drain electrode 16a are connected to an output terminal 34 via the output wiring 24. An output voltage Vsw is output from the output terminal 34.

The low-side source electrodes 15a and 15b common to the three low-side HEMTs 21a to 21c are connected to a ground terminal 35 via the ground wiring 25. The ground terminal 35 is set to have the ground voltage VGND lower than the power source voltage Vin.

The buck regulator circuit 10b has a similar circuit structure to that of the buck regulator circuit 10a. In the circuit, the second high-side HEMT 20b is connected to the low-side HEMTs 21d to 21f via the second/drain electrode 13b and the output wiring 24. The low-side HEMTs 21d to 21f are connected in parallel via the low-side source electrode 15b and 15c, the low-side drain electrode 16b, the output wiring 24 and the ground wiring 25.

Figure 3B:
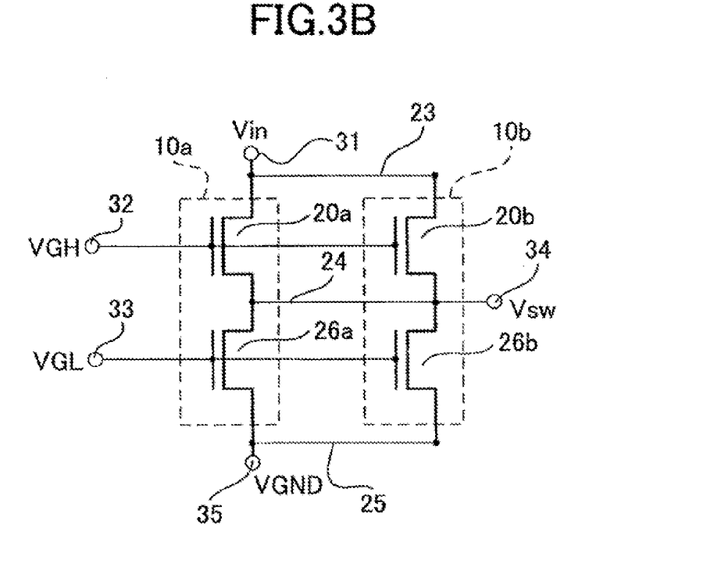

In both of the buck regulator circuits 10a and 10b, the low-side HEMTs 21a-21c and the low-side HEMTs 21d to 21f may be equivalent to low-side HEMTs 26a and 26b, respectively. The first and second high-side drain electrodes 11a and 11b mutually connected via the voltage applying wiring 23. Further, the low-side HEMTs 26a and 26b are connected in parallel via the output wiring 24 and the ground wiring 25.

With this, the first and second buck regulator circuits 10a and 10b are connected in parallel as illustrated in FIG. 3B.

The first and second buck regulator circuits 10a and 10b may apply a positive voltage Vin to the first and second high-side drain electrodes 11a and 11b of the first and second high-side HEMTs 20a and 20b.

Then, different on and off signals may be alternately applied to the high-side gate wiring 17 and the low-side gate wiring 18. Thus, a high voltage and a low voltage are alternately output from the output terminal 34. Instead of this, an on signal and an off signal may be alternately applied to the low-side gate wiring 18 while an on signal is being applied to the high-side gate wiring 17. Thus, a high voltage and a low voltage are alternately output from the output terminal 34.

With the Embodiment, the first source/drain electrodes 13a and 13b are provided as the source electrodes of the high-side HEMTs 20a and 20b and the drain electrodes of the low-side HEMTs 21a and 21f adjacent to the high-side HEMTs 20a and 20b.

With this, wirings connecting the high-side HEMT 20a and 20b to the low-side HEMTs 21a and 21f are unnecessitated to thereby prevent the performances of the buck regulator circuits 10a and 10b from degrading due to existence of inductances and resistances of the connecting wirings. The isolation region may not be provided between the high-side HEMTs 20a and 20b and the low-side HEMTs 21a and 21f. Therefore, the integration degree is enhanced.

The low-side HEMTs 21a to 21f share the low-side source electrodes 15a to 15c and the drain electrodes 16a and 16b. With this, another connecting wiring for connecting the adjacent low-side HEMTs 21a to 21f may not be provided. Therefore, the performances of the buck regulator circuits 10a and 10b is improved by preventing the inductances and the resistances of the connecting wirings from occurring. Further, the isolation regions may not be provided among the adjacent low-side HEMTs 21a to 21f. Therefore, the integration degree of the circuit elements are enhanced.

Figure 4:
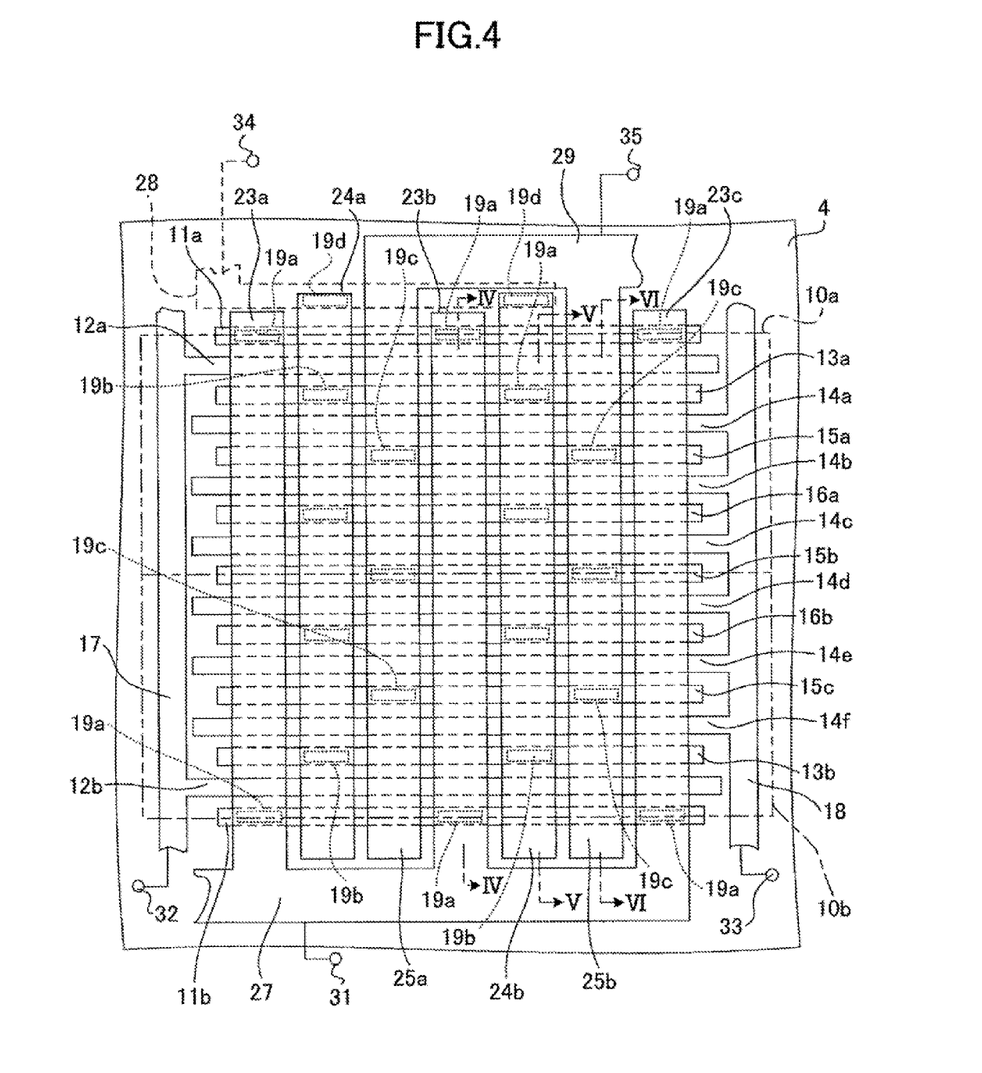
FIG. 4 is a plan view illustrating a semiconductor device of the Embodiment.

Meanwhile, the numbers of the voltage applying wirings 23, the output wirings 24 and the ground wirings 25, which are formed on the insulating layer 19 to mutually connecting the high-side HEMTs 20a and 20b and the low-side HEMTs 21a to 21f may be plural as illustrated in FIG. 4.

Referring to FIG. 4, the insulating layer 19 and the dielectric layers 5 are not illustrated in FIG. 4 for ease. The cross-sectional views taken along lines IV-IV, V-V and VI-VI are substantially similar to those illustrated in FIG. 2A, FIG. 2B and FIG. 2C.

Referring to FIG. 4, plural stripe-like voltage applying wirings 23a to 23c, plural stripe-like output wirings 24a and 24b and plural stripe-like ground wirings 25a and 25b are formed on the insulating layer 19 so as to traverse longitudinal directions of the high-side gate electrodes 12a and 12b and the low-side gate electrodes 14a to 14f.

The numbers of the voltage applying wirings 23a to 23c, the output wirings 24a and 24b and the ground wirings 25a and 25b may be at least two. The voltage applying wirings 23a to 23c, the output wirings 24a and 24b and the ground wirings 25a and 25b are formed from the high-side gate wiring 17 to the low-side gate wiring 18. The voltage applying wirings 23a to 23c, the output wirings 24a and 24b and the ground wirings 25a and 25b are alternately arranged while being interposed by gaps. Referring to FIG. 4, the voltage applying wirings 23a to 23c, the output wirings 24a and 24b and the ground wirings 25a and 25b are arranged in the order of the voltage applying wiring 23a, the output wiring 24a, the ground wiring 25a, the voltage applying wiring 23b, the output wiring 24b and the ground wiring 25b. On an opposite side of the output wiring 24b relative to the ground wiring 25b which is positioned the closest to the low-side gate wiring 18, a third voltage applying wiring 23c is formed while being interposed by a gap between the third voltage applying wiring 23c and the ground wiring 25b.

The three voltage applying wirings 23a to 23c are connected to the first and second high-side drain electrodes 11a and 11b via plural first via holes 19a separately formed in the insulating layer 19. The two output wirings 24a and 24b are connected to the first and second source/drain electrodes 13a and 13b and the low-side drain electrode 16a and 16b via plural second via holes 19b separately formed in the insulating layer 19. The two ground wirings 25a and 25b are connected to the low-side source electrodes 15a to 15c via plural via holes 19c separately formed in the insulating layer 19.

One ends of the voltage applying wirings 23a to 23c are connected to the first wiring 27 formed on the insulating layer 19. The ground wirings 25a and 25b are connected to the third wiring 29 formed on the insulating layer 19 at ends opposite to the one ends of the voltage applying wirings 23a to 23c connected to the first wiring 27.

The two output wirings 24a and 24b are connected to the second wiring 28 on the electron supplying layer 4 via fourth via holes 19d formed on a side of the first high-side drain electrode 11a. The second wiring 28 is formed on the dielectric layer 5.

With the wiring structure illustrated in FIG. 4, the plural voltage applying wirings 23a to 23c, the plural output wirings 24a and 24b and the plural ground wirings 25a and 25b are alternately formed. With this, scattering of voltage distributions in the first and second high-side drain electrodes 11a and 11b, the low-side source electrodes 15a to 15c and the low-side drain electrodes 16a and 16b are prevented from scattering. Therefore, operations of the high-side HEMTs 20a and 20b and the low-side HEMTs 21a to 21f are stabilized.

Although the first and second buck regulator circuits 10a and 10b are formed line-symmetric relative to the low-side source electrode 15b, it is also possible to add a third buck regulator (not illustrated) line-symmetric relative to second high-side drain electrode 11b inside the second buck regulator circuit 10b. The third buck regulator circuit may have a similar electrode arrangement to that of the first buck regulator circuit 10a.

By adopting the above line-symmetric structure relative to the low-side source electrode or the high-side drain electrode, the degree of integrating the circuit elements such as the adjacent buck regulator circuits is enhanced and a circuit characteristics are prevented from degrading. In this case, the low-side source electrode 15b or the high-side drain electrode 11b as the center of the line-symmetry is shared as the common electrode for the adjacent two HEMTs included in the two buck regulator circuits 10a and 10b.

Referring to FIG. 3A, the number of the above low-side HEMTs 21a-21f may be one or more. When the number is plural, the low-side HEMTs 21a-21f may be connected in parallel via the low-side drain electrodes 16a and 16b, the low-side source electrodes 15a, 15b, 15c and 15d, and the wiring 24 and 25. Referring to FIG. 3B, the number of the above low-side HEMTs 26a and 26b may be one or more. When the number is plural, the low-side HEMTs 26a and 26b may be connected in parallel via the low-side drain electrodes, the low-side source electrodes, and the wiring 24 and 25.

Although the above electron supplying layer 4 and the channel layer 3 are made of a group-III nitride semiconductor, the above electron supplying layer 4 and the channel layer 3 may be made of a gallium arsenide semiconductor, an indium arsenide semiconductor or an indium or gallium arsenide semiconductor.

Further, the HEMT is used as the transistor in the Embodiment, a metal-insulator-semiconductor field-effect transistor (MISFET) made of a composite semiconductor or a metal-Oxide-Semiconductor Field-Effect Transistor made of silicon. In these cases, the gate electrode, the source electrode and the drain electrode have the above structure.

In the above description, the terminology "connect" means not only "mechanically connect" but also "electrically connect".

With the Embodiment, the source electrode of the high-side field-effect transistor (FET) and the drain electrode of the low-side field-effect transistor (FET) are shared as the source and drain electrode. With this it is possible to omit a wiring connecting the high-side field-effect transistor (FET) to the low-side field-effect transistor (FET). Therefore, the inductance and the resistance of the wiring are not caused to thereby prevent the performance of the circuit from degrading. Further, the circuit element isolation region between the high-side field-effect transistor (FET) and the low-side field-effect transistor (FET) can be omitted to thereby enhance the degree of integrating the circuit elements.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a high-side field-effect transistor including a high-side drain electrode, a high-side gate electrode, and a high-side source electrode;
a first low-side field-effect transistor including a first low-side drain electrode, a first low-side gate electrode and a first low-side source electrode, the high-side source electrode and the first low-side drain electrode being shared as a single source and drain electrode;
a second low-side field-effect transistor including a second low-side drain electrode, and a second low-side gate electrode;
a semiconductor substrate on which the high-side drain electrode, the high-side gate electrode, the single source and drain electrode, the first low-side gate electrode and the first low-side source electrode are formed;
an insulating layer formed on the high-side drain electrode, the high-side gate electrode, the single source and drain electrode, the first low-side gate electrode, the first low-side source electrode, the second low-side drain electrode, and the second low-side gate electrode, the insulating layer having first holes which are formed above the second low-side drain electrode and the single source and drain electrode to penetrate through the insulating layer;
a first wiring connected to the second low-side drain electrode and the single source and drain electrode through the first holes;
a third low-side field-effect transistor including a third low-side gate electrode and a second low-side source electrode; and
a second wiring connecting the first low-side source electrode and the second low-side source electrode,
wherein the first low-side source electrode and the second low-side source electrode are connected by the second wiring via second holes formed above the first low-side source electrode and the second low-side source electrode to penetrate through the insulating layer, wherein the high-side drain electrode, the high-side gate electrode, the single source and drain electrode, the first low-side gate electrode, the first low-side source electrode, the second low-side gate electrode, the second low-side drain electrode, the third low-side gate electrode, and the second low-side source electrode are sequentially arranged while being interposed by gaps, respectively.

2. The semiconductor device according to claim 1, further comprising:
   another semiconductor device having similar constitutional elements and features to those of the semiconductor device according to claim 1,
   wherein the other semiconductor device has a line-symmetric structure in its plan view relative to a center line along a longitudinal direction of the second low-side source electrode and arranged in contact with the semiconductor device while sharing the second low-side source electrode.

3. The semiconductor device according to claim 1, further comprising:
   another semiconductor device having similar constitutional elements and features to those of the semiconductor device according to claim 1,
   wherein the other semiconductor device has a line-symmetric structure in its plan view relative to a center line along a longitudinal direction of the high-side drain electrode and arranged in contact with the semiconductor device while sharing the high-side drain electrode.

4. The semiconductor device according to claim 1,
wherein the semiconductor substrate has a laminated structure including an electron supplying layer formed on a channel layer.

5. The semiconductor device according to claim 1,
wherein the high-side drain electrode, the source and drain electrode, the second low-side drain electrode and the first low-side source electrode are in contact with the semiconductor substrate by an ohmic contact.

6. The semiconductor device according to claim 1,
wherein the high-side gate electrode and the first low-side gate electrode are formed on the semiconductor substrate via a dielectric layer.

7. The semiconductor device according to claim 1,
wherein the high-side drain electrode is set to have a first voltage, the first low-side source electrode is set to have a second voltage, and the first voltage is higher than the second voltage.

8. The semiconductor device according to claim 7,
wherein the high-side field-effect transistor and the first low-side field-effect transistor are alternately set to ON state.

9. The semiconductor device according to claim 1, further comprising:
   a third wiring connected to the high-side drain electrode, wherein the first wiring, the second wiring, and the third wiring are formed by patterning a metallic film formed on the insulating layer.

\* \* \* \* \*